(12) United States Patent
Hovis et al.

(10) Patent No.: US 7,661,084 B2
(45) Date of Patent: *Feb. 9, 2010

(54) IMPLEMENTING MEMORY READ DATA EYE STRETCHER

(75) Inventors: William Paul Hovis, Rochester, MN (US); Paul W. Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 93 days.

This patent is subject to a terminal disclaimer.

(21) Appl. No.: 11/874,366

(22) Filed: Oct. 18, 2007

(65) Prior Publication Data

US 2009/0046813 A1 Feb. 19, 2009

Related U.S. Application Data

(63) Continuation-in-part of application No. 11/840,394, filed on Aug. 17, 2007.

(51) Int. Cl.
    *G06F 17/50* (2006.01)
(52) U.S. Cl. .................. 716/10; 716/8; 716/9; 716/11; 375/317; 711/167; 711/211; 365/189.09
(58) Field of Classification Search .............. 716/8–11; 375/317; 711/167, 211; 365/189.09
    See application file for complete search history.

(56) References Cited

U.S. PATENT DOCUMENTS

| | | | | |
|---|---|---|---|---|
| 5,185,736 A * | 2/1993 | Tyrrell et al. | ................. | 370/358 |
| 6,067,260 A * | 5/2000 | Ooishi et al. | ................. | 365/200 |
| 6,477,110 B2 * | 11/2002 | Yoo et al. | .............. | 365/233.13 |
| 6,480,946 B1 * | 11/2002 | Tomishima et al. | ......... | 711/167 |
| 6,510,503 B2 | 1/2003 | Gillingham et al. | | |
| 6,807,108 B2 * | 10/2004 | Maruyama et al. | ...... | 365/189.05 |
| 7,269,709 B2 * | 9/2007 | Kelly | .......................... | 711/211 |
| 7,418,068 B2 | 8/2008 | Barrett et al. | | |
| 7,433,397 B2 * | 10/2008 | Garlepp et al. | ............... | 375/229 |
| 7,450,441 B2 * | 11/2008 | Lee | .............................. | 365/193 |
| 2004/0264260 A1 * | 12/2004 | Kono | .................... | 365/189.07 |
| 2007/0083491 A1 * | 4/2007 | Walmsley et al. | ............... | 707/3 |
| 2007/0195757 A1 * | 8/2007 | Michels | ...................... | 370/375 |
| 2007/0217559 A1 * | 9/2007 | Stott et al. | ................... | 375/355 |
| 2008/0310491 A1 * | 12/2008 | Abbasfar et al. | ............ | 375/230 |
| 2009/0046812 A1 * | 2/2009 | Hovis et al. | ................. | 375/317 |

OTHER PUBLICATIONS

Auto-thresholding Receiver System by DR Cecchi and RR Williams, TDB n10A 03-02 p. 202-204, Mar. 1, 1992 IPCOM000107577D Mar. 22, 2005.

* cited by examiner

*Primary Examiner*—Naum B Levin
(74) *Attorney, Agent, or Firm*—Joan Pennington

(57) ABSTRACT

A method and data receiver apparatus implement a high speed, such as double data rate (DDR), memory read data eye stretcher and a design structure on which the subject circuit resides is provided. Altering the reference level is performed to increase the size of the data eye. Knowledge of the previous data state is used to adjust the reference level for the current data being latched so that the data eye is maximized.

18 Claims, 8 Drawing Sheets

PRIOR ART

VREF    TYPICAL DATA EYE, PRIOR ART

DATA EYE WITH A PREVIOUS "0" OR TRI-STATE "0"

DATA EYE WITH A PREVIOUS "1" OR TRI-STATE "1"

DATA EYE WITH A PREVIOUS "VDD/2" OR MID-POINT TRI-STATE

EVEN MUX CONTROL LOGIC 512

| ODD DATA | DQS DELAYED | EVEN MUX OUT |
|---|---|---|
| 0 | 0 | VREF- |
| 0 | 1 | VREF |
| 1 | 0 | VREF+ |
| 1 | 1 | VREF |

FIG. 5B

ODD MUX CONTROL LOGIC 510

| EVEN DATA | /DQS DELAYED | ODD MUX OUT |
|---|---|---|
| 0 | 0 | VREF- |
| 0 | 1 | VREF |
| 1 | 0 | VREF+ |
| 1 | 1 | VREF |

FIG. 5C

EVEN MUX CONTROL
LOGIC 512 FOR DDR2

| CONTROLLER (CTL) | ODD DATA | DQS DELAYED | EVEN MUX OUT |
|---|---|---|---|
| 0 | 0 | 0 | VREF- |
| 0 | 0 | 1 | VREF |
| 0 | 1 | 0 | VREF+ |
| 0 | 1 | 1 | VREF |
| 1 | 0 | 0 | VREF |
| 1 | 0 | 1 | VREF |
| 1 | 1 | 0 | VREF |
| 1 | 1 | 1 | VREF |

IMPLEMENTING MEMORY READ DATA EYE STRETCHER

This application is a continuation-in-part application of Ser. No. 11/840,394 filed on Aug. 17, 2007.

FIELD OF THE INVENTION

The present invention relates generally to the data processing field, and more particularly, relates to a method and data receiver apparatus for implementing high speed storage, such as double data rate (DDR) memory, read data eye stretcher, and a design structure on which the subject circuit resides.

DESCRIPTION OF THE RELATED ART

Capture of data and commands in any electrical bus includes a certain percentage of the usable data eye taken up with transition time on both the rising and falling edges that may exist around the time that the values are captured.

In all systems, it is desirable to maximize the data eye being captured in order to improve setup and hold time, and to center the capture of the data within the usable data eye. The ability to maximize this time is critical to improving how fast a particular signal, bus, or interface can operate.

Referring to FIGS. 1A, 1B, 1C, and 1D, prior art aspects of conventional data latching schemes are illustrated. FIG. 1A illustrates a typical data eye with a mid point reference level indicated by a dotted line labeled VREF. The reference level VREF is supplied externally, as in many known systems that use a voltage reference signal. The reference level VREF typically is set to be a mid-point between a low and high level.

FIG. 1B illustrates a typical first read data stage including one path latching even data and another path latching odd data. An odd latch 102 provides an output of odd data, and an even latch 104 provides an output of even data. A data signal DQ is applied to comparator 106 receiving a midpoint voltage reference level VREF. A source synchronous clock strobe DQS is applied to comparator 108 receiving either a midpoint voltage reference level VREF, or an inverted DQS signal (/DQS). The strobe DQS is applied to a ½ cycle delay 110 and the delayed strobe DQS output of the ½ cycle delay 110 is applied to clock the even latch 104. The delayed output strobe DQS of the ½ cycle delay 110 is applied to an inverter 112 inverted and applied to clock the odd latch 102.

FIG. 1C illustrates a conventional data latching timing diagram for double-data-rate two (DDR2) and double-data-rate three (DDR3) synchronous dynamic random access memory (SDRAM) interfaces. FIG. 1D illustrates conventional data latching timing diagram for graphics double-data-rate three (GDDR3) SDRAM interfaces. SDRAM interfaces are implemented by a random access memory technology used for high-speed storage of working data of a computer or other data processing system.

A need exists for an effective receiver mechanism that maximizes the data eye being captured to provide improved setup and hold time, and to center the capture of the data within the usable data eye.

SUMMARY OF THE INVENTION

Principal aspects of the present invention are to provide a method and data receiver apparatus for implementing high speed, such as double data rate (DDR), memory read data eye stretcher, and a design structure on which the subject circuit resides. Other important aspects of the present invention are to provide such a method and data receiver apparatus substantially without negative effect and that overcome many of the disadvantages of prior art arrangements.

In brief, a method and apparatus for implementing memory read data eye stretcher, and a design structure on which the subject circuit resides are provided. A plurality of input data paths is provided, each receiving input data and a respective reference level. A pair of data latches is coupled to each of the input data paths, an even data latch latching even data and an odd data latch latching odd data. A reference level is selected for the current data being latched based upon the previous data state of latched data to maximize the data eye.

In accordance with features of the invention, the data eye is improved by effectively reducing the amount of time that a signal spends in transition, from 1 to 0 and 0 to 1, by altering the receiver reference level. Altering the reference level enables in essence that the setup time is improved or stretched earlier in time.

In accordance with features of the invention, the data state of the latched even data is coupled to logic controlling a multiplexer coupled to the odd data latch. The data state of the latched odd data is coupled to logic controlling a multiplexer coupled to the even data latch. Knowing this previous data state, a portion of the transition time can effectively be reduced allowing the data receiver apparatus to operate at higher speeds.

BRIEF DESCRIPTION OF THE DRAWINGS

The present invention together with the above and other objects and advantages may best be understood from the following detailed description of the preferred embodiments of the invention illustrated in the drawings, wherein:

FIGS. 5B, and 5C are simplified tables respectively illustrating the operation of an even multiplexer control logic and an odd multiplexer control logic of the data receiver apparatus of FIG. 5A;

FIG. 6A is a more detailed table illustrating the operation of an even multiplexer control logic including a controller input (CTL) of the data receiver apparatus of FIG. 5A;

DETAILED DESCRIPTION OF THE PREFERRED EMBODIMENTS

In accordance with features of the invention, a method improves the data eye by effectively reducing the amount of time that a signal spends in transition (from 1 to 0 or 0 to 1) in systems by effectively altering the receiver reference level. A plurality of reference levels are provided including, a VREF signal, that is set to be a mid-point between a low and high level, such as VDD/2, a VREF+ signal, that is set above the VREF signal, and a VREF− signal, that is set below the VREF signal.

Figure 2:
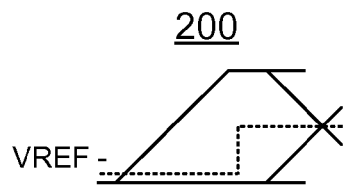
FIGS. 2, 3, and 4 are waveform diagrams illustrating respective data eyes implemented in accordance with the preferred embodiment.
Figure 3:
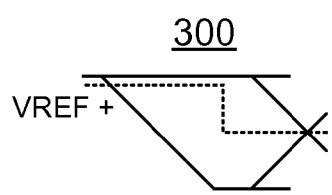
Figure 4:
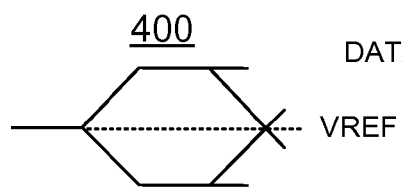

Having reference now to the drawings, FIGS. 2, 3, and 4 illustrate respective data eyes in accordance with the preferred embodiment. Improved data eyes are provided by effectively reducing the amount of time that a signal spends in transition (from 1 to 0 or 0 to 1) in data receivers by effectively altering the receiver input voltage reference level.

FIG. 2 illustrates a data eye generally designated by the reference character 200 in accordance with the preferred embodiment with the voltage reference level VREF− signal, that is set below the VREF signal. The setup time for the data eye 200 is implemented with the voltage reference level VREF− signal with a previous "0" or tri-state "0" in accordance with the preferred embodiment. The voltage reference level is set to VREF for the hold side of the data eye 200.

FIG. 3 illustrates a data eye generally designated by the reference character 300 in accordance with the preferred embodiment with the VREF+ signal, that is set above the VREF signal. The setup time for the data eye 300 is implemented with the VREF+ signal with a previous "1" or tri-state "1" in accordance with the preferred embodiment. The voltage reference level is set to VREF for the hold side of the data eye 300.

FIG. 4 illustrates a data eye generally designated by the reference character 400 in accordance with the preferred embodiment with the VREF or VDD/2 signal. The setup time and the hold time for the data eye 400 are implemented with the VREF signal with a previous VDD/2 or midpoint tri-state in accordance with the preferred embodiment.

Figure 5A:
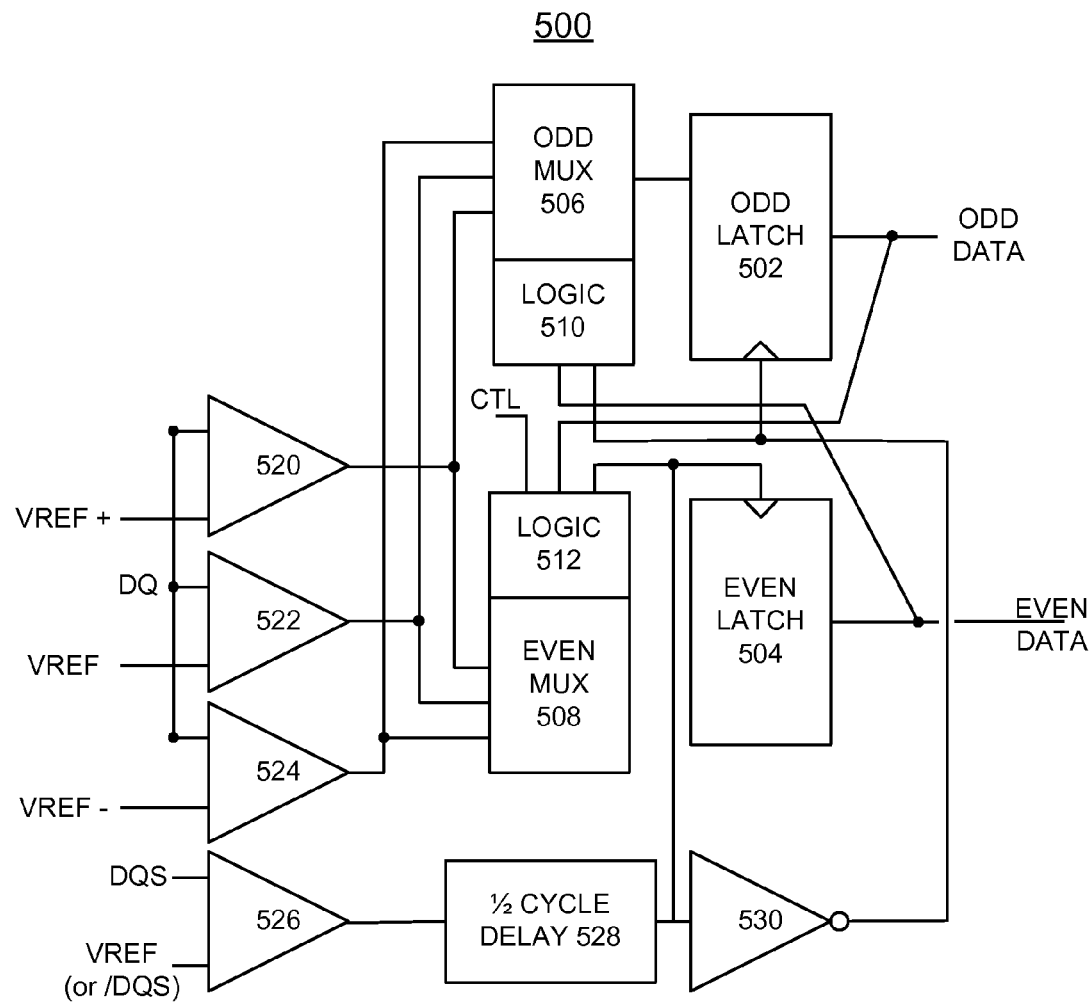
FIG. 5A is a schematic diagram illustrating data receiver apparatus for implementing high-speed memory read data eye stretcher in accordance with the preferred embodiment.

Referring now to FIG. 5A, there is shown a receiver apparatus generally designated by the reference character 500 in accordance with the preferred embodiment. Receiver apparatus 500 includes an eye stretching first read data stage including one path latching even data and another path latching odd data.

An odd latch 502 provides a latched data output of odd data, and an even latch 504 provides a latched data output of even data. A respective one of a pair of odd and even multiplexers (MUXs) 506, 508 is coupled to the odd latch 502 and the even latch 504. An odd multiplexer control logic 510 and an even multiplexer control logic 512 respectively operatively control the odd and even multiplexers (MUXs) 506, 508.

Receiver apparatus 500 includes a plurality of data paths, each receiving input data DQ and a respective reference level. The input data signal DQ is applied to a plurality of data receiving comparators 520, 522, 524. A reference voltage level, VREF+ above the midpoint reference voltage level VREF is applied to the data receiving comparator 520. The mid-reference voltage level VREF is applied to the data receiving comparator 522. A reference voltage level, VREF− below the midpoint reference voltage level VREF is applied to the data receiving comparator 524. An output of each of the data receiving comparators 520, 522, 524 is applied to both the odd and even multiplexers (MUXs) 506, 508. The odd data output of odd latch 502 is applied to an input of the even multiplexer control logic 512. The even data output of even latch 504 is applied to an input of the odd multiplexer control logic 510. The output of one of the data receiving comparators 520, 522, 524 is selected by the odd and even multiplexer control logic 510, 512 based upon the previous data state and applied by the odd and even multiplexers (MUXs) 506, 508 to the odd latch 502 and the even latch 504.

A source synchronous clock strobe DQS is applied to a strobe receiving comparator 526 that also receives the midpoint voltage reference level VREF or /DQS. The strobe DQS output of the comparator 526 is applied to a ½ cycle delay 528. The delayed strobe DQS output of the ½ cycle delay 528 is applied to the even multiplexer control logic 512 and the even latch 504. The delayed strobe DQS output of the ½ cycle delay 528 is applied to an inverter 530, inverted and applied to the odd multiplexer control logic 510 and the clock input of the odd latch 502.

In accordance with features of the preferred embodiment, by having a receiver apparatus 500 with the voltage reference level VREF or VDD/2 and the voltage reference levels above and below VDD/2 (VREF+ and VREF−), through the respective MUX 506, 508, the best receiver output is selected for the setup side, and VDD/2 for the hold side.

Having reference to FIGS. 5B, and 5C and FIGS. 6A, and 6B, operation of receiver apparatus 500 may be further understood. With each odd and even receiver latch 502, 504, the unique control arrangement of MUX 506 and odd multiplexer control logic 510, and MUX 508 and even multiplexer control logic 512 is used along with knowledge of the previous state by the receiver apparatus 500 to adjust the reference level being used in the current data being latched so that the data eye can be maximized, or stretched. As a result, a portion of the transition time can effectively be reduced allowing the receiver apparatus 500 or data interface to operate at higher speeds.

Figure 1A:
FIG. 1A illustrates a prior art data eye with a mid point voltage reference level VREF.

Having reference also to FIGS. 2, 3, and 4, the receiver apparatus 500 of the preferred embodiment allows the data eye to be stretched as shown. As shown in FIGS. 2, 3, and 4, the knowledge of the preceding latched data state is used to alter the reference level so that in essence the setup time advantageously is improved or stretched earlier in time. Enabling this function requires more than one receiver for each data latch pin, or the hold time of the preceding bit would be compromised. The cases of a previous "0" or tri-state "0" and a previous "1" or tri-state "1" are the classic form of the improvement that can be gained, as illustrated in FIGS. 2 and 3. The case of a previous mid-point termination is shown in FIG. 4 and the receiver apparatus 500 of the preferred embodiment provides a larger data eye than the prior art data eye shown in FIG. 1A. When the receiver apparatus 500 is used, with a non-altered reference VREF for the leading edge and trailing edge, capturing the first bit when coming out of tri-state provides a comparable gain to the illustrated data eye examples of FIGS. 2 and 3.

Referring now to FIGS. 5B, and 5C, there are shown simplified TRUTH tables respectively illustrating the operation of the even multiplexer control logic 512 and the odd multiplexer control logic 510 of the data receiver apparatus 500.

As shown in FIG. 5B, with previous "0" odd data and DQS delayed of "0", the VREF− reference level is the selected output of the even MUX 508. With previous "0" odd data and DQS delayed of "1", the VREF mid-reference level is the selected output of the even MUX 508. With previous "1" odd data and DQS delayed of "0", the VREF+ reference level is the selected output of the even MUX 508. With previous "1" odd data and DQS delayed of "1", the VREF mid-reference level is the selected output of the even MUX 508.

As shown in FIG. 5C, with previous "0" even data and inverted DQS (/DQS) delayed of "0", the VREF− reference level is the selected output of the odd MUX 506. With previous "0" even data and /DQS delayed of "1", the VREF mid-reference level is the selected output of the odd MUX 506. With previous "1" even data and /DQS delayed of "0", the VREF+ reference level is the selected output of the odd MUX 506. With previous "1" even data and /DQS delayed of "1", the VREF mid-reference level is the selected output of the odd MUX 506.

In accordance with features of the preferred embodiment, receiver apparatus 500 receives a controller input CTL indicating when data is coming from an unused condition, or tri-state, with the level during tri-state being predetermined as high, low, or any mid-point termination value. The controller input CTL is applied to the even MUX control logic 512 shown in FIG. 5A.

Figure 1B:
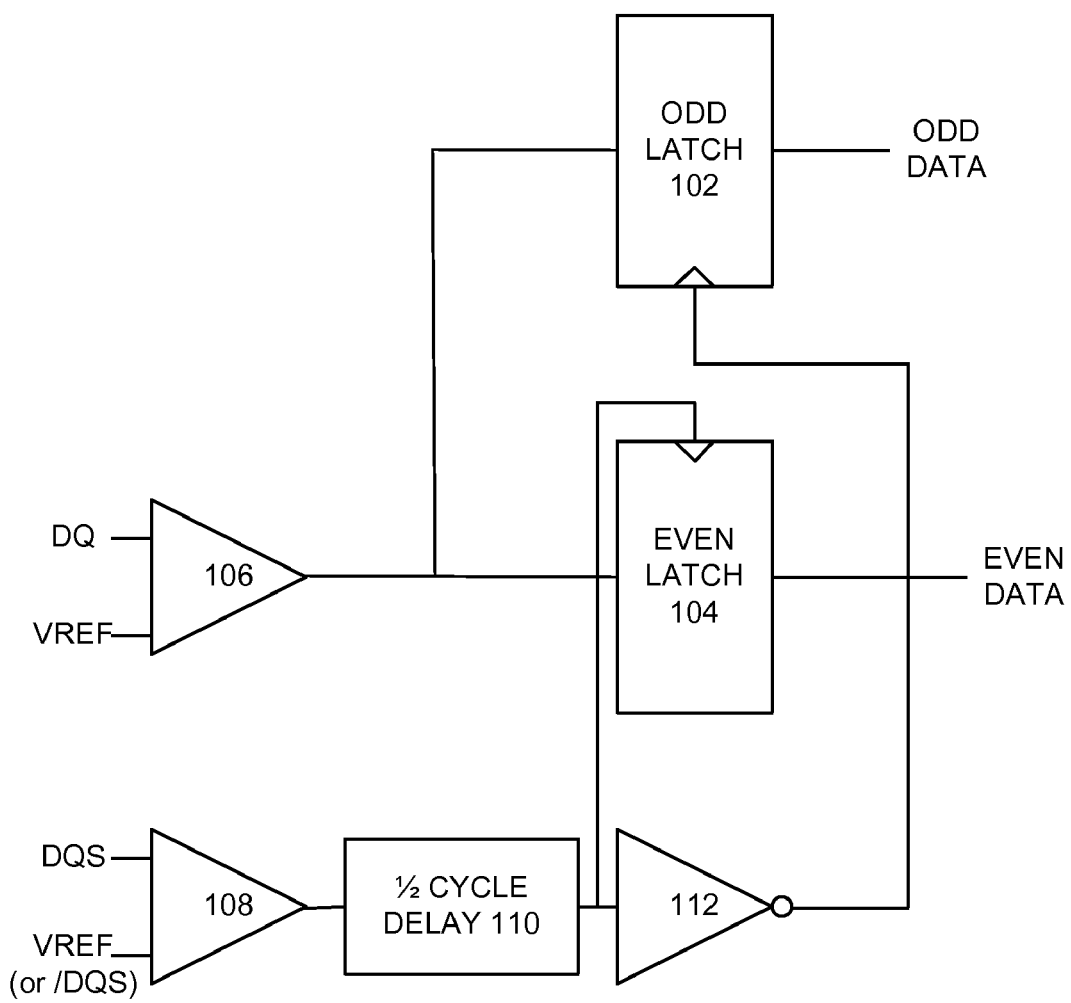
FIG. 1B illustrates a prior art typical first read data stage including one path latching even data and another path latching odd data.
Figure 1C:
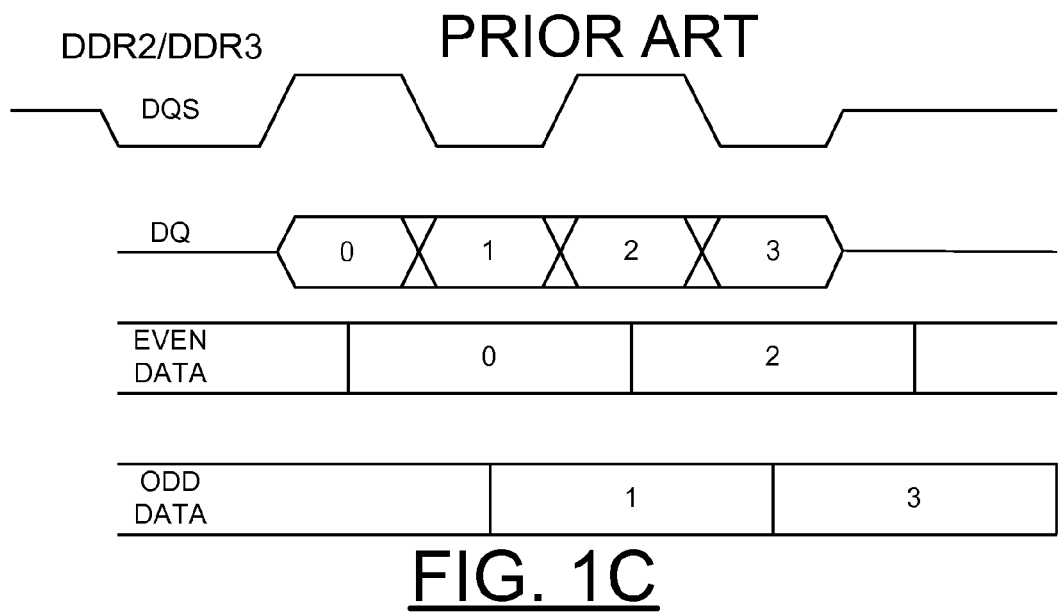
FIGS. 1C, and 1D illustrate conventional data latching waveforms for the prior art first read data stage of FIG. 1B for double-data-rate two (DDR2) and double-data-rate three (DDR3), and graphics double-data-rate three (GDDR3) synchronous dynamic random access memory (SDRAM) interfaces.
Figure 1D:
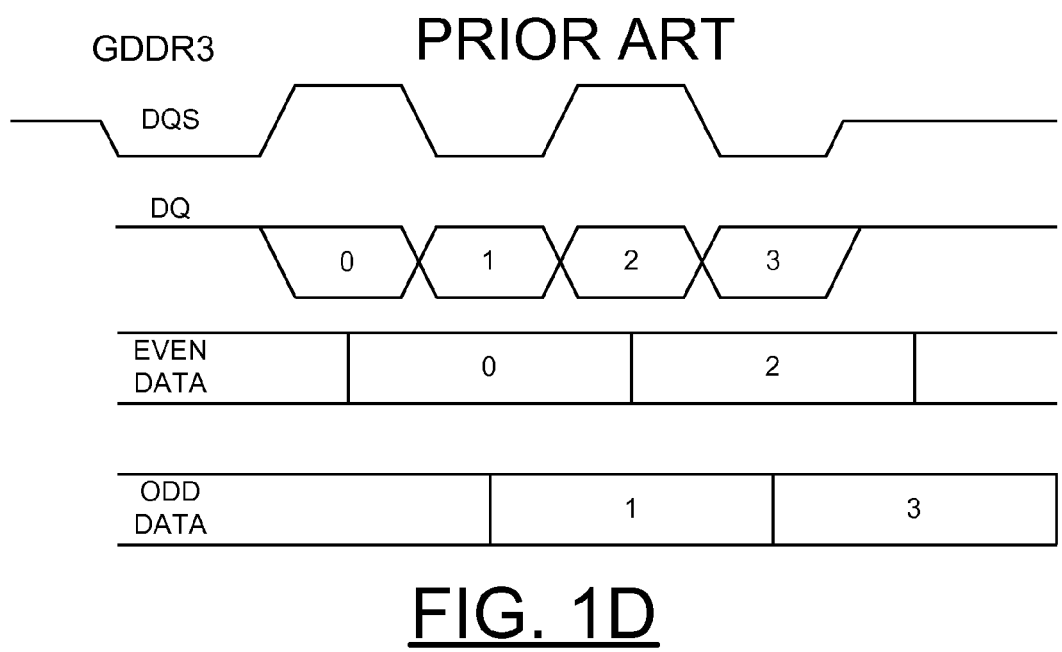

If the received DQ signal is terminated to VDD, as shown in FIG. 1D, the simple tables in FIG. 5B and FIG. 5C apply and the CTL signal forces the even MUX control logic 512 to select the VREF+ path of comparator 520 for the setup portion of the first data bit after the tri-state condition.

If the received DQ signal is terminated to GND (not shown but similar), the simple tables in FIG. 5B and FIG. 5C apply and the CTL signal forces the even MUX control logic 512 to select the VREF− path of comparator 524 for the setup portion of the first data bit after the tri-state condition.

If the DQ signal is terminated to VDD/2, as shown in FIG. 1C, the CTL signal is used by the even MUX control logic 512 to select the VDD/2 path of comparator 522 for the first data received after the tri-state condition and the truth table of FIG. 5C is valid for the odd MUX control logic 510 and the truth table of FIG. 6A is valid for the even MUX control logic 512.

The ½ cycle DQS delay 528 can now be set earlier in the data eye window to center the timing margins. Also note that FIG. 5A is a simplified diagram of receiver apparatus 500 and that DQS delays slightly before and after the latch delays advantageously are used to guarantee a glitch proof MUX transition. It should be understood that although only a scheme with an external reference is shown, this concept can also be applied to interfaces that only have internally generated reference or receiver levels. In this case the receivers would simply be centered for the VDD/2 case and biased low and high for the − and + voltage reference levels, respectively.

Referring also FIG. 6A, there is shown a more detailed table illustrating the operation of the even multiplexer control logic 512 including the controller input (CTL) of the data receiver apparatus 500. The information CTL from the controller feeds into the even multiplexer control logic 512 since the controller knows exactly when to expect data and when to expect tri-state on the interface. The signal in this example is shown to be a 1 when tri-state is expected on the leading edge of the first bit. There is a fairly wide window for when this signal can be on as shown. The truth table of FIG. 6A shows how that multiplexer control logic 512 operates for all conditions including the tri-state control when asserted active positive.

Figure 6B:
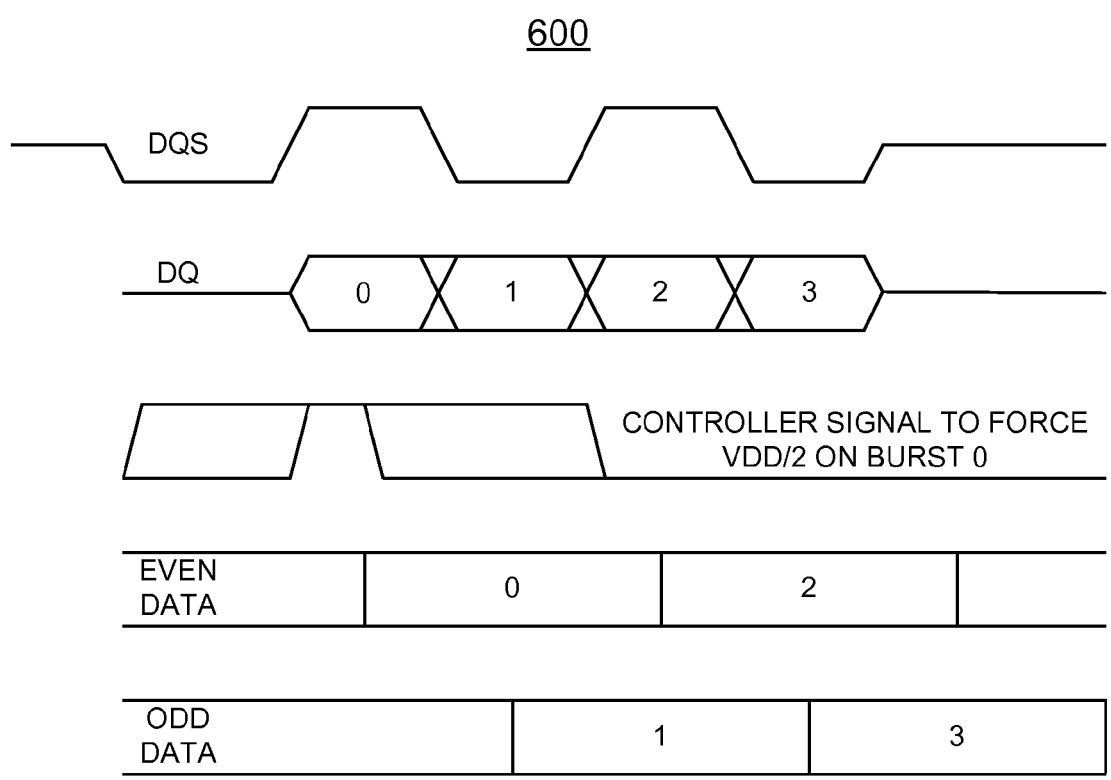
FIG. 6B illustrates data latching waveforms for the data receiver apparatus of FIG. 5A in accordance with the preferred embodiment for double-data-rate two (DDR2) and double-data-rate three (DDR3) synchronous dynamic random access memory (SDRAM) interface operation.

FIG. 6B illustrates data latching waveforms for the data receiver apparatus 500 in accordance with the preferred embodiment for double-data-rate two (DDR2) and double-data-rate three (DDR3) synchronous dynamic random access memory (SDRAM) interface operation.

It should be understood that the present invention is not limited to the illustrated embodiment of the data receiver apparatus 500. For example, data receiver apparatus 500 could be architected so that as opposed to controlling the decision before the data is latched, the reference voltage level could also be determined in a similar fashion after the data is latched. Such arrangement of data receiver apparatus 500 requires multiple latches with the decision logic about which latch to use implemented after captured data. The appropriate data to use would then have to be selected before use later in the data pipe. Such arrangement of data receiver apparatus 500 requires more overhead in terms of transistor count, area, and power, so that the illustrated data receiver apparatus 500 is the preferred, simpler implementation option.

Figure 7:
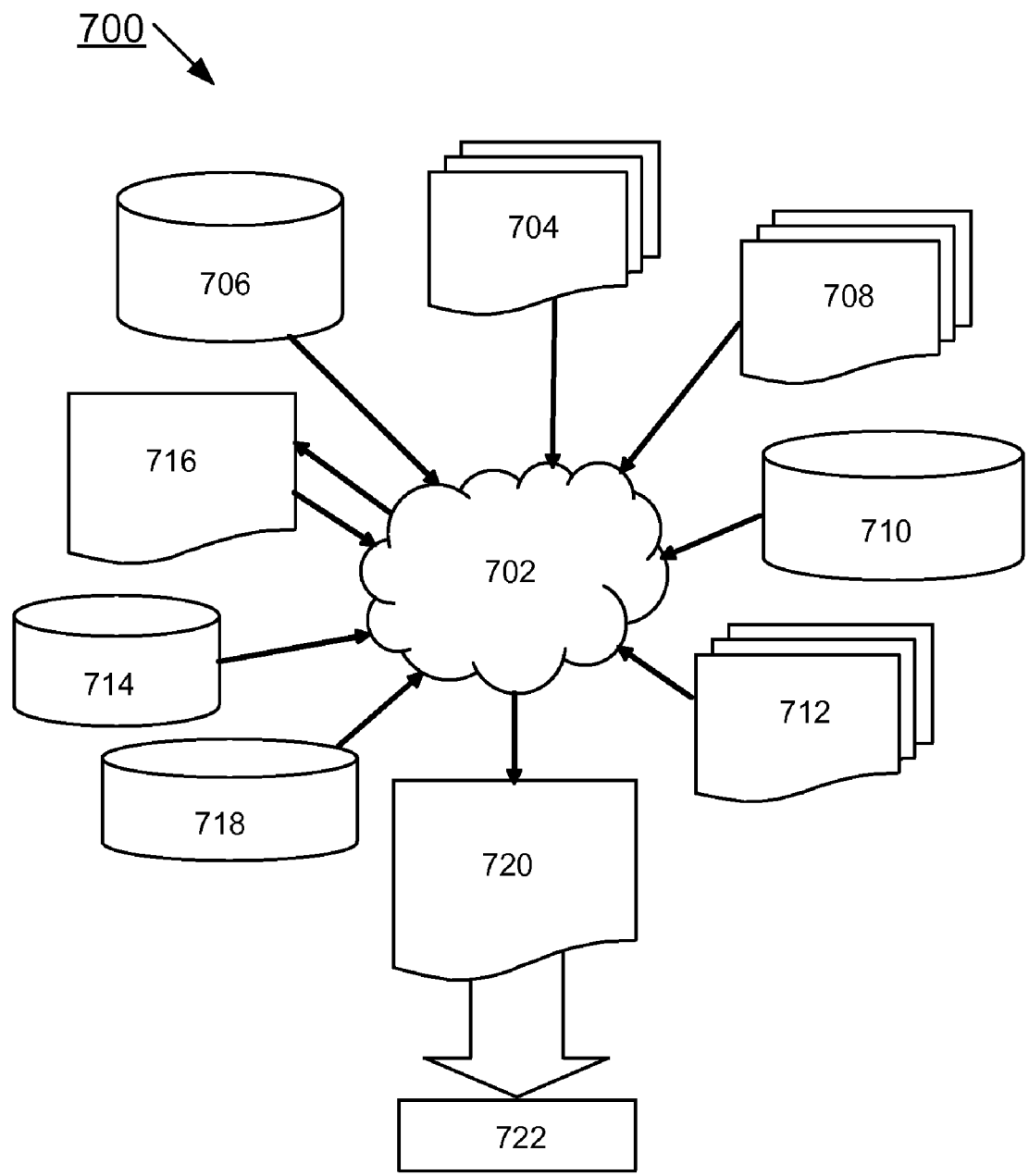
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuit 500 in the form of schematics or HDL, a hardware-description language, for example, Verilog, VHDL, C, and the like. Design structure 702 may be contained on one or more machine readable medium. For example, design structure 702 may be a text file or a graphical representation of circuit 500. Design process 704 preferably synthesizes, or translates, circuit 500 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuit.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 45 nm, 90 nm, and the like, design specifications 710, characterization data 712, verification data 714, design rules 716, and test data files 718, which may include test patterns and other testing information.

Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIG. 5A along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 5A. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A design structure embodied in a computer-readable storage medium used in a design process, the design structure comprising:
   a data receiver circuit tangibly embodied in the computer-readable storage medium used in the design process, said data receiver circuit for implementing memory storage read data eye stretcher; said data receiver circuit including
   a plurality of input data paths, each input data path receiving input data and a respective voltage reference level;
   a pair of data latches coupled to each of the input data paths; said pair of data latches including an even data latch latching even data and an odd data latch latching odd data;
   control logic selecting one voltage reference level to maximize a data eye for current data being latched based upon a previous data state of latched data;
   a respective one of said pair of data latches latching said current data responsive to said selected voltage reference level; and
   wherein said plurality of input data paths includes an odd multiplexer coupled to said odd data latch and an even multiplexer coupled to said even data latch; wherein the design structure, when read and used in the manufacture of a semiconductor chip produces a chip comprising said data receiver circuit.

2. The design structure of claim 1, wherein the design structure comprises a netlist, which describes said data receiver circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1, wherein each of said plurality of input data paths includes a comparator receiving said input data and said respective voltage reference level.

6. The design structure of claim 1, wherein said plurality of input data paths includes a first comparator receiving said input data and a middle-point voltage reference level.

7. The design structure of claim 6, wherein said plurality of input data paths includes a second comparator receiving said input data and a second voltage reference level above said middle-point voltage reference level.

8. The design structure of claim 7, wherein said plurality of input data paths includes a third comparator receiving said input data and a third voltage reference level below said middle-point voltage reference level.

9. The design structure of claim 1, wherein said plurality of input data paths includes a plurality of data receiving comparators, each of said plurality of data receiving comparators receiving said input data and one said respective voltage reference level.

10. The design structure of claim 9, wherein an output of each of said data receiving comparators is applied to both said odd multiplexer and even multiplexer.

11. The design structure of claim 10, wherein said control logic includes odd multiplexer control logic controlling said odd multiplexer and even control logic controlling said even multiplexer.

12. The design structure of claim 11, wherein said odd multiplexer control logic receives an input of a latched data state of said even latch and selects one said voltage reference level to maximize a data eye for the current data being latched by said odd latch, and said even multiplexer control logic receives an input of a latched data state of said odd latch and selects one said voltage reference level to maximize a data eye for the current data being latched by said even latch.

13. The design structure of claim 11, wherein each of said odd multiplexer control logic and said even multiplexer control logic, responsive to said input of a latched data state of one, selects a voltage reference level above a middle voltage reference level to maximize a data eye for the current data being latched.

14. The design structure of claim 11, wherein each of said odd multiplexer control logic and said even multiplexer control logic, responsive to said input of a latched data state of zero, selects a voltage reference level below a middle voltage reference level to maximize a data eye for the current data being latched.

15. The design structure of claim 11, wherein one of said odd multiplexer control logic and said even multiplexer control logic is responsive to a tri-state input for selecting a reference level for said tri-state value.

16. The design structure of claim 15, wherein said control logic, responsive to said tri-state input of one, selects said voltage reference level above said middle voltage reference level; said control logic, responsive to said tri-state input of zero, selects said voltage reference level above said middle voltage reference level; and said control logic, responsive to said tri-state input of a mid-point tri-state value, selects said voltage reference level of said middle voltage reference level.

17. A design structure embodied in a computer-readable storage medium used in a design process, the design structure comprising:
   a data receiver circuit tangibly embodied in the computer-readable storage medium used in the design process, said data receiver circuit for implementing memory storage read data eye stretcher; said data receiver circuit including
   a plurality of input data paths, each input data path receiving input data and a respective voltage reference level;
   a pair of data latches coupled to each of the input data paths; said pair of data latches including an even data latch latching even data and an odd data latch latching odd data;
   control logic selecting one voltage reference level to maximize a data eye for current data being latched based upon a previous data state of latched data;
   a respective one of said pair of data latches latching said current data responsive to said selected voltage reference level; and
   an even multiplexer coupled to said even data latch and an odd multiplexer coupled to said odd data latch; and wherein said control logic includes odd multiplexer control logic controlling said odd multiplexer and even control logic controlling said even multiplexer; wherein the design structure, when read and used in the manufacture of a semiconductor chip produces a chip comprising said data receiver circuit.

18. The design structure of claim 17 includes a clock strobe applied to said even multiplexer control logic and said even latch, and an inverter inverting said clock strobe, and said inverted clock strobe applied to said odd multiplexer control logic and said odd latch.

* * * * *